United States Patent
Chung et al.

(10) Patent No.: US 11,189,675 B2
(45) Date of Patent: Nov. 30, 2021

(54) DISPLAY MODULE, DISPLAY APPARATUS INCLUDING THE SAME AND METHOD OF MANUFACTURING DISPLAY MODULE

(71) Applicant: SAMSUNG ELECTRONICS CO., LTD., Suwon-si (KR)

(72) Inventors: Changkyu Chung, Suwon-si (KR); Changjoon Lee, Suwon-si (KR); Kyungwoon Jang, Suwon-si (KR); Gyun Heo, Suwon-si (KR); Youngjun Moon, Suwon-si (KR); Kwangrae Jo, Suwon-si (KR); Soonmin Hong, Suwon-si (KR); Daesuck Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/680,764

(22) Filed: Nov. 12, 2019

(65) Prior Publication Data
US 2020/0152721 A1 May 14, 2020

(30) Foreign Application Priority Data
Nov. 12, 2018 (KR) .................. 10-2018-0138435

(51) Int. Cl.
*H01L 27/32* (2006.01)
*H01L 27/15* (2006.01)
(Continued)

(52) U.S. Cl.
CPC ......... *H01L 27/3248* (2013.01); *H05B 33/10* (2013.01); *H05B 45/20* (2020.01); *H01L 27/156* (2013.01)

(58) Field of Classification Search
CPC ............... H01L 27/3248; H01L 27/156; H01L 25/0753; H01L 33/62; H05B 33/0587
(Continued)

(56) References Cited

U.S. PATENT DOCUMENTS 6,455,878 B1 * 9/2002 Bhat et al. ...................... 257/96
6,723,627 B1   4/2004 Kariyazaki et al.
(Continued)

FOREIGN PATENT DOCUMENTS

CN     108336077 A    7/2018
JP     2017-183481 A  10/2017
(Continued)

OTHER PUBLICATIONS

International Search Report (PCT/ISA/210) dated Feb. 20, 2020 issued by the International Searching Authority in International Application No. PCT/KR2019/015146.
(Continued)

*Primary Examiner* — Thinh T Nguyen
(74) *Attorney, Agent, or Firm* — Sughrue Mion, PLLC

(57) ABSTRACT

A display module, a display apparatus including a display module, and a method of manufacturing a display module are provided. The method of manufacturing a display module includes forming a non-conductive layer that includes a fluxing function on a substrate, providing a plurality of light-emitting diodes (LEDs) on the substrate, wherein each LED of the plurality of LEDs has a first electrode pad and a second electrode pad spaced apart by a predetermined interval, and the substrate has a plurality of connection pads that are configured to electrically connect to the first electrode pads and the second electrode pads; thermally compressing the plurality of LEDs; and electrically connecting the plurality of LEDs and the substrate via a plurality of
(Continued)

soldering members that are provided on at least one of the plurality of LEDs or the substrate.

12 Claims, 13 Drawing Sheets

(51) Int. Cl.
   *H05B 33/10* (2006.01)
   *H05B 45/20* (2020.01)
(58) Field of Classification Search
   USPC .................................. 257/72, 79; 438/22, 48
   See application file for complete search history.

(56) References Cited

U.S. PATENT DOCUMENTS

| | | |
|---|---|---|
| 10,020,420 B2 | 7/2018 | Zou et al. |
| 10,811,580 B2 | 10/2020 | Yu et al. |
| 2004/0082111 A1 | 4/2004 | Yamauchi |
| 2011/0237028 A1 | 9/2011 | Hamazaki et al. |
| 2014/0367705 A1 | 12/2014 | Bibi et al. |
| 2016/0300745 A1 | 10/2016 | Chang et al. |
| 2018/0052275 A1 | 2/2018 | Lee et al. |
| 2018/0076369 A1 | 3/2018 | Cheng et al. |
| 2018/0122786 A1 | 5/2018 | Wu et al. |
| 2018/0190747 A1 | 7/2018 | Son et al. |
| 2019/0181317 A1 | 6/2019 | Yu et al. |
| 2021/0013389 A1 | 1/2021 | Yu et al. |

FOREIGN PATENT DOCUMENTS

| | | |
|---|---|---|
| KR | 10-1232409 B1 | 2/2013 |
| KR | 10-2014-0052931 A | 5/2014 |
| KR | 10-2018-0073971 A | 7/2018 |

OTHER PUBLICATIONS

Written Opinion (PCT/ISA/237) dated Feb. 20, 2020 issued by the International Searching Authority in International Application No. PCT/KR2019/015146.

Jang, K.-S., et al. "Solvent-free fluxing underfill film for electrical interconnection", European Microelectronics Packing Conference, Sep. 10-13, 2017, pp. 1-4.

Communication dated Sep. 10, 2021 issued by the European Patent Office in European Application No. 19885327.7.

\* cited by examiner

DISPLAY MODULE, DISPLAY APPARATUS INCLUDING THE SAME AND METHOD OF MANUFACTURING DISPLAY MODULE

CROSS-REFERENCE TO RELATED APPLICATION(S)

This application is based on and claims priority under 35 U.S.C. § 119 to Korean Patent Application No. 10-2018-0138435, filed on Nov. 12, 2018, in the Korean Intellectual Property Office, the disclosure of which is incorporated by reference herein in its entirety.

BACKGROUND

1. Field

The disclosure relates to a display module having a simplified manufacturing process, a display apparatus including the display module, and a method of manufacturing the display module.

2. Description of Related Art

A micro light-emitting diode (LED) is a micro-sized inorganic light-emitting material that emits light without the usage of a color filter and backlight. Specifically, a micro LED may refer to a micro-sized LED having a width, a length, and a height, respectively, of 10 to 100 micrometers (µm). In other words, a micro LED may have an area that is substantially one hundredth the size of a general LED chip.

A micro LED may be electrically connected to a target substrate for control of driving and operating the micro LED, and may be physically fixed on the target substrate to operate at a preset location.

A micro LED may be electrically and physically connected to the target substrate via a metal bonding method (e.g., soldering). However, a short may occur between adjacent solders formed on each micro LED due to the extremely fine size, or contact between the micro LED and the target substrate may not be stable.

During soldering, even if oxidation of the solder is prevented using a flux between the micro LED and the target substrate, a separate process of flux cleaning may be additionally required. In addition, in order to prevent a short between the solders, a separate process may be further required to fill a side-fill and an under-fill, which are resinous materials, between the micro LED and the target substrate.

However, even through these additional processes, the micro LED might have a problem in that, due to the fine size, the flux caught between the solders is not cleaned well, or under-fill is not filled between the micro LEDs and between the plurality of electrode pads of the micro LEDs.

SUMMARY

Provided are a display module of which manufacturing process is simplified, a display apparatus including the same, and a method of manufacturing of the display module.

Additional aspects will be set forth in part in the description which follows and, in part, will be apparent from the description, or may be learned by practice of the presented embodiments.

In accordance with an aspect of the disclosure, there is provided a method of manufacturing a display module, the method including: forming a non-conductive layer that includes a fluxing function on a substrate; providing a plurality of light-emitting diodes (LEDs) on the substrate, each LED of the plurality of LEDs having a first electrode pad and a second electrode pad spaced apart by a predetermined interval, and the substrate having a plurality of connection pads that are configured to electrically connect to the first electrode pads and the second electrode pads; thermally compressing the plurality of LEDs; and electrically connecting the plurality of LEDs and the substrate via a plurality of soldering members that are provided on at least one of the plurality of LEDs or the substrate.

The method may further include forming the plurality of soldering members on the first electrode pads and the second electrode pads.

The plurality of soldering members may be provided between the first and second electrode pads and the plurality of connection pads.

The non-conductive layer including the fluxing function may fill a portion between the plurality of soldering members.

The method may further include forming the plurality of soldering members on the plurality of connection pads prior to forming the non-conductive layer.

The non-conductive layer including the fluxing function may be hardened simultaneously with thermal compression of the plurality of LEDs.

In accordance with an aspect of the disclosure, there is provided a display module including: a substrate; a plurality of light-emitting diodes (LEDs) configured to emit light; a plurality of soldering members provided between the substrate and the plurality of LEDs, and configured to electrically connect the plurality of LEDs and the substrate; and a non-conductive layer provided on the substrate, and configured to fill gaps between the plurality of soldering members.

The non-conductive layer may surround respective portions of the plurality of LEDs.

Each LED of the plurality of LEDs may include a first electrode pad and a second electrode pad that are spaced apart by a predetermined interval, the substrate may include a plurality of connection pads that are electrically connected to the first electrode pads and the second electrode pads, and each soldering member of the plurality of soldering members may be provided between the first and second electrode pads and the plurality of connection pads.

The first electrode pad and the second electrode pad of at least one LED may be spaced apart by an interval of less than or equal to 20 micrometers.

An upper surface of the non-conductive layer may be lower than respective upper surfaces of the plurality of LEDs.

The plurality of LEDs may include a first LED configured to emit red light; a second LED configured to emit green light; and a third LED configured to emit blue light.

The first LED, the second LED, and the third LED may be sequentially arranged on the substrate.

In accordance with an aspect of the disclosure, there is provided display apparatus including: a plurality of display modules; an array plate configured to support the plurality of display modules so that the plurality of display modules are provided in parallel on a same plane; and a housing configured to fix the plurality of display modules and the array plate, wherein each display module of the plurality of display modules includes: a substrate; a plurality of light-emitting diodes (LEDs) provided on the substrate, and configured to emit light; a plurality of soldering members provided between the substrate and the plurality of LEDs, and configured to electrically connect the plurality of LEDs and the substrate; and a non-conductive layer formed on the substrate, and configured to fill gaps between the plurality of soldering members.

The non-conductive layer may surround respective portions of the plurality of LEDs.

The non-conductive layer may be configured to fill gaps between the plurality of display modules.

The non-conductive layer that is formed on an upper portion of each display module of the plurality of display modules may be integrally formed.

Each LED of the plurality of LEDs may include a first electrode pad and a second electrode pad that are spaced apart by a predetermined interval, the substrate may include a plurality of connection pads that are electrically connected to the first electrode pads and the second electrode pads, and each soldering member of the plurality of soldering members may be provided between the first and second electrode pads and the plurality of connection pads.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
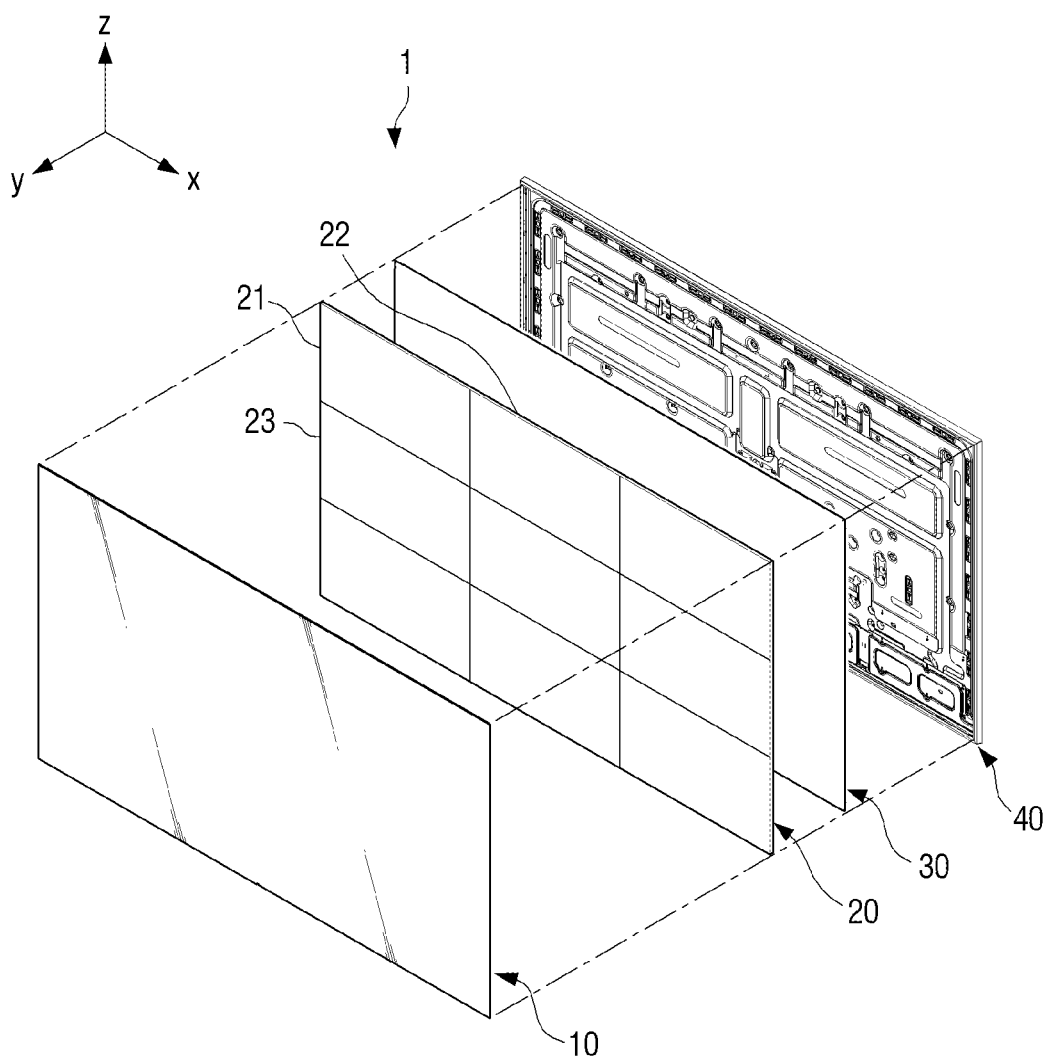
FIG. 1 is an exploded perspective view illustrating a display apparatus according to an embodiment.

Examples described hereinafter are provided for comprehensive understanding of the disclosure, and it should be understood that various changes can be made to examples described herein and the disclosure can be embodied in different forms. In addition, in the following description, detailed descriptions of well-known functions or configurations may be omitted so as to not obscure the subject matter of the disclosure.

In addition, it should be noted that the drawings are provided for comprehensive understanding of the disclosure, and the dimensions of some elements may be exaggerated for clarity and convenience. Throughout the drawings, it should be noted that like reference numbers are used to depict the same or similar elements, features, and structures.

It will be understood that when an element is referred to as being "on" or "connected to" another element, the element may be directly connected to the other element or intervening elements may also be present. Further, when an element is referred to as being "directly on" or "directly connected to" another element, no intervening elements may be present. Other expressions describing relationships between components such as "between" and "directly adjacent to" may be construed in a similar manner as "connected to" and "directly connected to," respectively.

The terms such as "first," "second," etc., may be used to describe a variety of elements, but the elements should not be limited by these terms. The terms may be used to distinguish an element from another element. The use of such ordinal numbers should not be construed as limiting the meaning of the term. For example, without departing from the scope of the disclosure, a "first component" may be referred to as a "second component," and similarly, the "second component" may also be referred to as a "first component."

Singular forms in the disclosure may include the plural forms as well, unless the context clearly indicates otherwise. It will be further understood that terms such as "including," "having," etc., may indicate the existence of the features, numbers, operations, actions, components, parts, or combinations thereof, disclosed in the specification, and are not intended to preclude the possibility that one or more other features, numbers, operations, actions, components, parts, or combinations thereof, may exist or may be added.

Unless otherwise defined, all terms used herein have the same meaning as commonly understood by one of ordinary skill in the art to which this disclosure pertains.

The display module according to an embodiment of the disclosure may be applied to an electronic product or an electronic device such as a wearable device, a portable device, a handheld device, a display device, etc. The display module may also be applied to a small display device such as a monitor for a personal computer, a television (TV), etc., and a large display device such as a digital sign, an electronic display having a plurality of assembly arrangements, etc.

Hereinafter, referring to FIG. 1, a structure of a display apparatus 1 according to an embodiment will be described.

FIG. 1 is an exploded perspective view illustrating the display apparatus 1 according to an embodiment.

The display apparatus 1 may be an apparatus configured to process an image signal received from an external source, and visually display a processed image, and may be implemented as various types of apparatuses. For example, the display apparatus 1 may be a television, a monitor, a portable multimedia device, a portable communication device, or the like.

As illustrated in FIG. 1, the display apparatus 1 may include a protection plate 10, a plurality of display modules 20, an array plate 30, and a housing 40.

The protection plate 10 may be arranged on a front surface (e.g., in the Y-axis direction) of the display apparatus 1, and may protect the plurality of display modules 20 arranged at a rear side of the protection plate 10 from external disturbances.

The protection plate 10 may be formed of a glass material with a thin thickness, or of various materials.

The plurality of display modules 20 may be configured to display an image in a front direction (e.g., in the Y-axis direction) according to the image signal that is input from the external device.

The plurality of display modules 20 may be arranged to fit the size of a display that each display module 20 is configured to implement, and may collectively constitute a display screen.

For example, when first and second display modules 21 and 22 are arranged in a row in a horizontal direction (e.g., the X-axis direction), the display screen may be implemented such that a width of the display screen in the horizontal direction (e.g., the X-axis direction) is greater than a height of the display screen in the vertical direction (e.g., the Z-axis direction).

When the first and third display modules 21 and 23 are arranged in a vertical direction (e.g., the Z-axis direction) in a side by side manner, the display screen may be implemented such that the height of the display screen in the vertical direction (e.g., the Z-axis direction) is greater than the width of the display screen in the horizontal direction (e.g., the X-axis direction).

According to the number and arrangement of the plurality of display modules 20, display screens of various sizes and formats may be implemented.

A specific description of the display module 20 will be given with reference to FIGS. 2 and 3.

The array plate 30 may be a plate on which the plurality of display modules 20 may be arranged, and is arranged on a rear surface of the plurality of display modules 20. The array plate 30 may be formed as a flat plate, and may be formed in various shapes and sizes, based on the shape and size of the display modules 20.

Accordingly, the array plate 30 may support the plurality of display modules 20 so that the plurality of display modules 20 are arranged in parallel on the same plane, and implement a uniform brightness of the display screen by implementing the same height between the display modules 20.

A housing 40 may form an appearance of the display apparatus 1, may be arranged at a rear side of the array plate 30, and may fix the plurality of display modules 20 and the array plate 30 in a stable manner.

The housing 40 may fix edge regions of the array plate 30 in a stable manner.

Accordingly, the housing 40 may isolate the various components included in the display apparatus 10 from external exposure, and may protect various components included in the display apparatus 1 from external disturbances.

Figure 2:
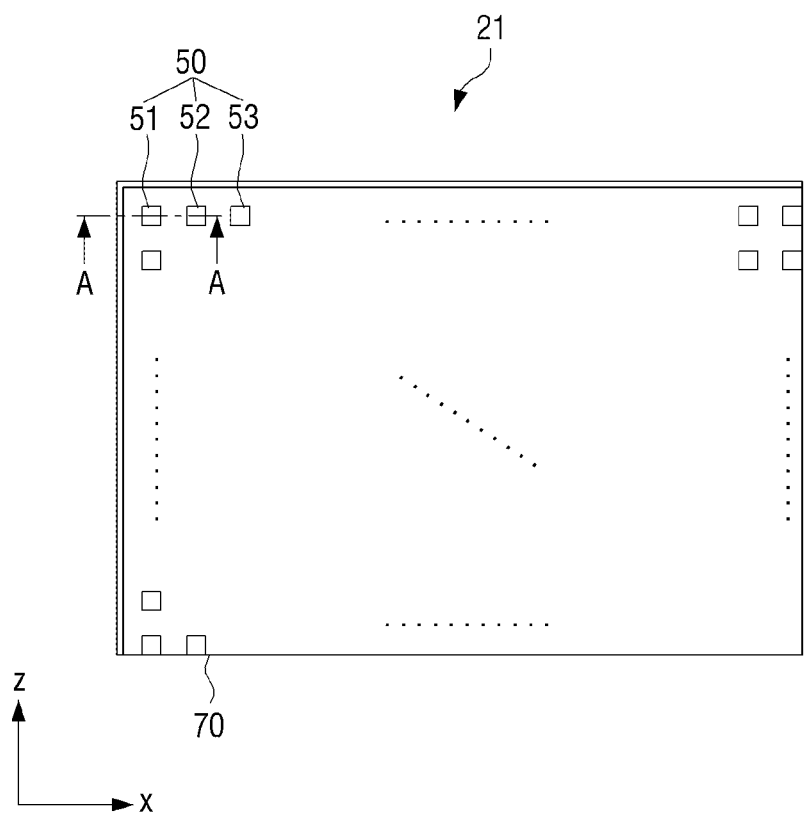
FIG. 2 is a top view illustrating a display module according to an embodiment.
Figure 3:
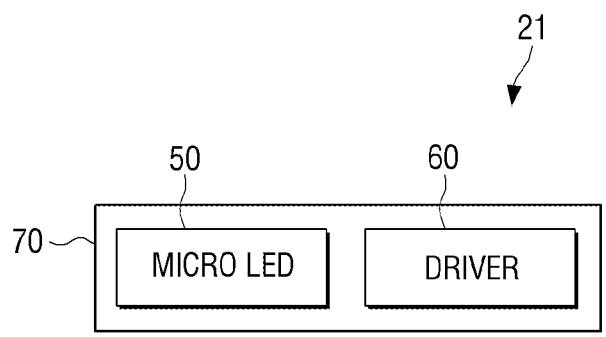
FIG. 3 is a block diagram illustrating an operation of the display module.

Referring to FIGS. 2 and 3, a specific structure and operation of the display module 20 will be described.

FIG. 2 is a top view illustrating a display module 21 according to an embodiment, and FIG. 3 is a block diagram illustrating an operation of the display module 21.

Although FIG. 1 illustrates multiple display modules 20, a first display module 21 will be described herein for convenience of description. The display module 22, the display module 23, and other non-labelled display modules may be substantially the same as the first display module 21.

The first display module 21 may include a plurality of micro LEDs 50 (e.g., micro LED 51, micro LED 52, micro LED 53, etc.), a substrate 70 on which the micro LEDs 50 are arranged in a lattice shape, and a driver 60 which drives each micro LED 50.

The micro LED 50 is formed of an inorganic light-emitting material having, respectively, a width, a length, and a height less than or equal to 100 μm, is arranged on the substrate 70, and is configured to emit light.

The plurality of micro LEDs 50 may include a first micro LED 51 that emits red light, a second micro LED 52 that emits green light, and a third LED 53 that emits blue light.

In addition, the first to third micro LEDs 51, 52, and 53 may be sequentially arranged on the substrate 70.

Accordingly, the first to third micro LEDs 51, 52, and 53 may collectively form a pixel configured to implement various colors.

In FIG. 2, it is illustrated that the first to third micro LEDs 51, 52, and 53, which are sub-pixels, are sequentially arranged on the substrate 70, but the first to third micro LEDs 51, 52, and 53 may form a pixel.

Even when the first to third micro LEDs 51, 52, 53 form a pixel, the structure in which a non-conductive layer 80 including a fluxing function is formed between the first to third micro LEDs 51, 52, and 53 and the substrate 70 may be the same.

Micro LEDs 50 having fast response rate, low power consumption, and high luminance are gaining spotlight as light-emitting elements of next generation displays. Specifically, micro LEDs 50 are more efficient in converting electricity into photons as compared to related-art liquid crystal displays (LCDs) and organic light-emitting diode (OLED) displays.

That is, "brightness per Watt" is greater as compared to related-art LCD or OLED displays. In this way, micro LEDs 50 may provide a similar brightness as LCD or OLED displays while consuming substantially half as much energy as such displays.

In addition to the foregoing, micro LEDs 50 are capable of providing high resolution, outstanding color, contrast and brightness, may accurately provide a wide range of colors, and may provide a clear screen even in the outdoors under direct and bright sunlight. In addition, micro LEDs 50 are resistant to burn-in phenomenon, and generate less heat, thereby improving product lifespan and reducing deformation.

The substrate 70 may be electrically connected to the micro LEDs 50 that are mounted on the substrate 70 in the form of a matrix, respectively, and may control the micro LEDs 50 via a driving signal of the driver 60.

The substrate 70 may be a thin film transistor (TFT) substrate, a wafer, a printed circuit board (PCB), a flexible PCB, or the like.

In addition, the substrate 70 may be formed of various materials such as a ductile material, a glass, a plastic, or the like.

The driver 60 may control each micro LED 50, and may be connected to the substrate 70 via chip on class (COG) bonding or via film on glass (FOG) bonding on an edge area or a rear side of the substrate 70.

The position of the driver 60 on the substrate 70, and the bonding method of the driver 60 to the substrate 70 may vary.

Hereinafter, referring to FIG. 4, a specific structure of the display module 21 that includes the non-conductive layer 80 including a fluxing function will be described.

Figure 4:
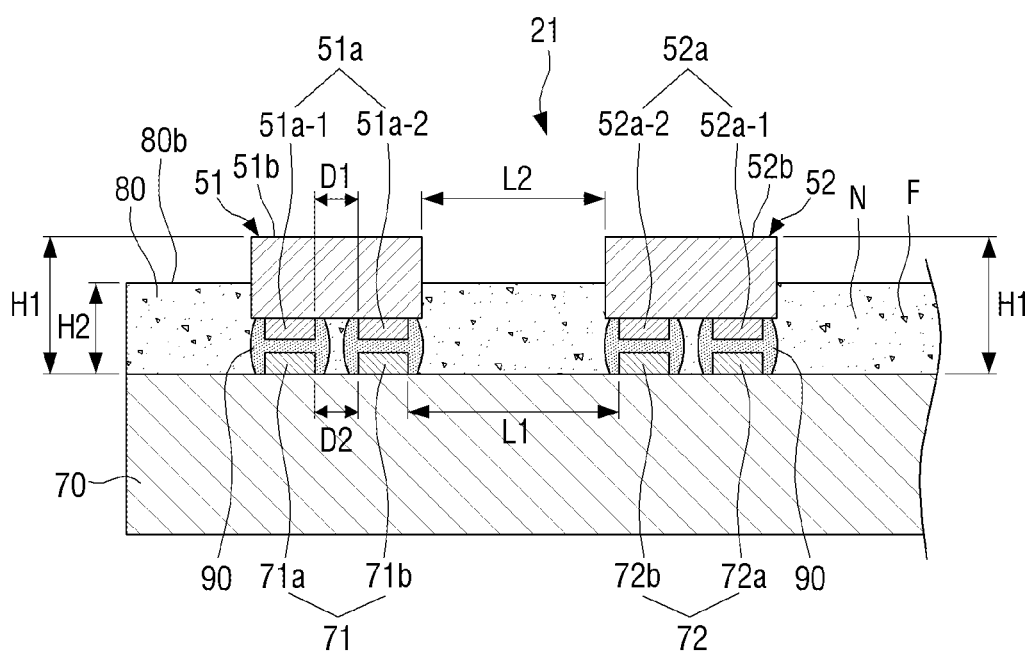
FIG. 4 is a sectional view illustrated along A-A line of FIG. 2.

FIG. 4 is a sectional view illustrated along A-A line of FIG. 2.

As shown in FIG. 4, the display module 21 may include the substrate 70, a plurality of micro LEDs 50 configured to irradiate light, a plurality of soldering members 90 arranged between the substrate 70 and the plurality of micro LEDs 50 for electrically connecting the plurality of micro LEDs 50 and the substrate 70, and the non-conductive layer 80 formed on the substrate 70 to fill gaps between the plurality of soldering members 90.

The plurality of micro LEDs 51 and 52 may include first electrode pads 51$a$-1 and 52$a$-1, and second electrode pads 51$a$-2 and 52$a$-2 arranged on a surface in a predetermined interval D1.

For example, the first electrode pad 51*a*-1 and the second electrode pad 51*a*-2 may be spaced apart by a preset interval D1, and may be arranged on a surface of the first micro LED 51.

Similarly, on a surface of the second micro LED 52, the second electrode pad 52*a*-1 and the second electrode pad 52*a*-2 may be spaced apart by a preset interval D1.

The first and second electrode pads 51*a*-1 and 51*a*-2 formed on the first micro LED 51, and the first and second electrode pads 52*a*-1 and 52*a*-2 formed on the second micro LED 52 may be substantially the same. Accordingly, the following description of the first and second electrode pads 51*a*-1 and 51*a*-2 of the first micro LED 51 may be applicable to the first and second electrode pads 52*a*-1 and 52*a*-2 of the second micro LED 52.

The first electrode pad 51*a*-1 and the second electrode pad 51*a*-2 may be spaced apart by a preset interval D1. The first electrode pad 51*a*-1 and the second electrode pad 51*a*-2 may have different potential values to drive the first micro LED 51.

Accordingly, the first electrode pad 51*a*-1 and the second electrode pad 51*a*-2 may be spaced apart by an interval D1 which is predetermined in order to maintain a substantially constant potential difference.

Here, the predetermined interval D1 may be less than or equal to 20 μm. Accordingly, the first electrode pad 51*a*-1 and the second electrode pad 51*a*-2 may be physically spaced apart, and the micro LED 50 having the size of 100 μm or less may be operated while maintaining a potential difference.

In addition, the first electrode pad 51*a*-1 may be a p-pad, and the second electrode pad 51*a*-2 may be an n-pad. The pad may not be limited thereto, and the first electrode pad 51*a*-1 may be an n-pad and the second electrode pad 51*a*-2 may be a p-pad.

The first electrode pad 51*a*-1 and the second electrode pad 51*a*-2 may be arranged on the same surface of the first micro LED 51. That is, the first micro LED 51 may be a flip chip. Similarly, the plurality of micro LEDs 50 may be flip chips.

The substrate 70 may be electrically connected to each of the first and second electrode pads 51*a*-1 and 51*a*-2, and may include a plurality of connection pads 71 and 72 (e.g., as shown in FIG. 4) arranged on the substrate 70 and spaced apart by a predetermined interval.

The plurality of connection pads 71 and 72 may be made of a conductive material, and may be electrically connected to each of the first and second electrode pads 51*a* and 52*a* of the micro LEDs 51 and 52.

For example, the first connection pad 71 on the substrate 70 may include a 1-1 connection pad 71*a* and 1-2 connection pad 71*b*. The 1-1 connection pad 71*a* may be electrically connected to the first electrode pad 51*a*-1 of the micro LED 51, and the 1-2 connection pad 71*b* may be electrically connected to the second electrode pad 51*a*-2 of the micro LED 51.

The 1-1 connection pad 71*a* and the 1-2 connection pad 71*b* may have different potentials, and may not physically contact each other in order to maintain a substantially constant potential difference.

Accordingly, the 1-1 connection pad 71*a* and the 1-2 connection pad 71*b* may be spaced apart by a preset interval D2.

The first connection pad 71 may include a pair of connection pads, and a shape of the first connection pad 71 may vary.

A plurality of connection pads 71 and 72 arranged on the substrate 70 may be formed to have a structure that is substantially identical to the first connection pad 71.

The second connection pad 72 may be spaced apart by a first interval L1 with the first connection pad 71.

The first interval L1 between the first connection pad 71 and the second connection pad 72 may be based on the second interval L2 between the plurality of micro LEDs 51 and 52 which are arranged to be spaced apart from each other based on brightness, color, or the like which the first display apparatus 1 is configured to implement.

That is, the plurality of micro LEDs 51 and 52 may be respectively arranged at the positions corresponding to each of the plurality of connection pads 71 and 72 on the substrate 70. Therefore, the plurality of connection pads 71 and 72 may be formed to be spaced apart by the first interval L1.

For example, as illustrated in FIG. 4, since the first micro LED 51 is arranged on the first connection pad 71, and the second micro LED 52 is arranged on the second connection pad 72, an increase in the first interval L1 between the first connection pad 71 and the second connection pad 72 may correspond to an increase in the second interval L2 between the first micro LED 51 and the second micro LED 52.

The plurality of soldering members 90 may be arranged between the substrate 70 and the plurality of micro LEDs 50, respectively, and may electrically connect the plurality of micro LEDs 50 and the substrate 70.

Specifically, each of the plurality of soldering members 90 may be arranged between the first electrode pads 51*a*-1 and 52*a*-1 and the second electrode pads 51*a*-2 and 52*a*-2, and the plurality of connection pads 71 and 72.

For example, the soldering member 90 may be arranged between the first electrode pad 51*a*-1 and the 1-1 connection pad 71*a*, and between the second electrode pad 51*a*-2 and the 1-2 connection pad 71*b*, respectively.

The soldering member 90 may be made of a conductive material and may be used for metal bonding. For example, metal bonding may be performed through various materials of the soldering member 90, such as gold-indium (Au—In) bonding, gold-tin (Au—Sn) bonding, copper (Cu) pillar/tin-silver (SnAg) bump bonding, and nickel (Ni) pillar/SnAg bump bonding, or the like.

Accordingly, the soldering member 90 may electrically connect the plurality of micro LEDs 50 and the substrate 70, and may fix the plurality of micro LEDs 50 on the substrate 70.

The non-conductive layer 80 including a fluxing function may include a flux particle F to implement a fluxing function.

The non-conductive layer 80 may be made of a non-conductive material. For example, the non-conductive layer 80 may be formed of a thermosetting resin. The main components of the thermosetting resin may include an epoxy resin, a phenol resin, a polyimide resin, a polyurethane resin, a melamine resin, a urea resin, or the like.

The thermosetting resin may include one or more of the above resins. In addition, the thermosetting resin may be liquid at room temperature, and if a solid resin is employed, the solid resin may be used in combination with the thermosetting resin that is liquid at room temperature.

Accordingly, the non-conductive layer 80 including a fluxing function may fill the gaps between the plurality of soldering members 90 to prevent the soldering members 90 from being electrically connected, and thereby preventing an electric short from occurring.

The non-conductive layer 80 including a fluxing function may allow the micro LED 50 to be driven in an electrically stable manner.

The fluxing function may, when the soldering member 90 is melted to electrically connect the first and second electrode pads 51a and 52a of the micro LED 50 and the plurality of connection pads 71 and 72, deoxidize a part of the surface of the oxidized soldering member 90 by the flux particles F, and cause the coating film to be pushed by the molten soldering member 90 to prevent the soldering member 90 from being oxidized.

The flux particles F may be arranged to surround a surface of the soldering member 90, and prevent oxidization of the soldering member 90 by isolating external oxygen and the surface of the soldering member 90.

For example, the flux particles F may include inorganic flux including zinc chloride and zinc chloride-ammonia chloride; organic flux including glutamic acid hydrochloride urea, ethylene diamine stearic acid hydrochloride, rosin-based flux including inactivate/activate rosin, a water-soluble flux including salts, acids, amine, or the like.

In order to enhance the fluxing effect, an organic acid, such as a dibasic acid having an alkyl group in the side chain, may be deployed. Such dibasic acids are not particularly limited, but may have 6 carbon atoms or more. As an alkyl group adopted to configure a side chain, a lower alkyl group which has 1-5 carbon atoms may be adopted. The number of alkyl groups adopted to constitute the side chain may be singular or plural. If multiple alkyl groups are included in the molecule of the organic acid, these alkyl groups may be identical or non-identical.

The non-conductive layer 80 including a fluxing function may be formed by combining the flux particle F with the thermosetting resin material N.

Accordingly, the non-conductive layer 80 including a fluxing function may prevent the soldering member 90 from being oxidized, and may fill the gaps between the plurality of soldering members 90. In this way, the non-conductive layer 80 may prevent the soldering members 90 from being electrically connected, and may prevent electrical shorts from occurring.

The flux particles F may adhere to a fixed position within the thermosetting resin material N based on the thermosetting resin material of the non-conductive layer 80 being hardened. That is, the thermosetting resin material N may be arranged between the flux particles F to prevent an electrical connection between the plurality of flux particles F.

The non-conductive layer 80 including a fluxing function may be arranged to surround a portion of the plurality of micro LEDs 51 and 52. Accordingly, the non-conductive layer 80 including a fluxing function may stably fix the plurality of micro LEDs 51 and 52 onto the substrate 70.

Therefore, the plurality of micro LEDs 51 and 52 may be spaced apart from the substrate 70, the first height H1 from the substrate 70 to the plurality of micro LEDs 51 and 52 may be maintained, and uniform brightness of the display apparatus 1 may be implemented.

An upper surface 80b of the non-conductive layer 80 may be arranged lower than upper surfaces 51b and 52b of the plurality of micro LEDs 51 and 52. Specifically, the second height H2 from the substrate 70 to the upper surface 80b of the non-conductive layer 80 may be less than the first height H1 from the substrate 70 to the upper surfaces 51b and 52b of the micro LEDs 51 and 52.

Accordingly, the non-conductive layer 80 may fix the micro LEDs 51 and 52 at a predetermined position on the substrate 70, and may not conceal the upper surfaces 51b and 52b of the micro LEDs 51 and 52 which emit light. Accordingly, the non-conductive layer 80 may not adversely affect the brightness of the micro LEDs 51 and 52.

Figure 5A:
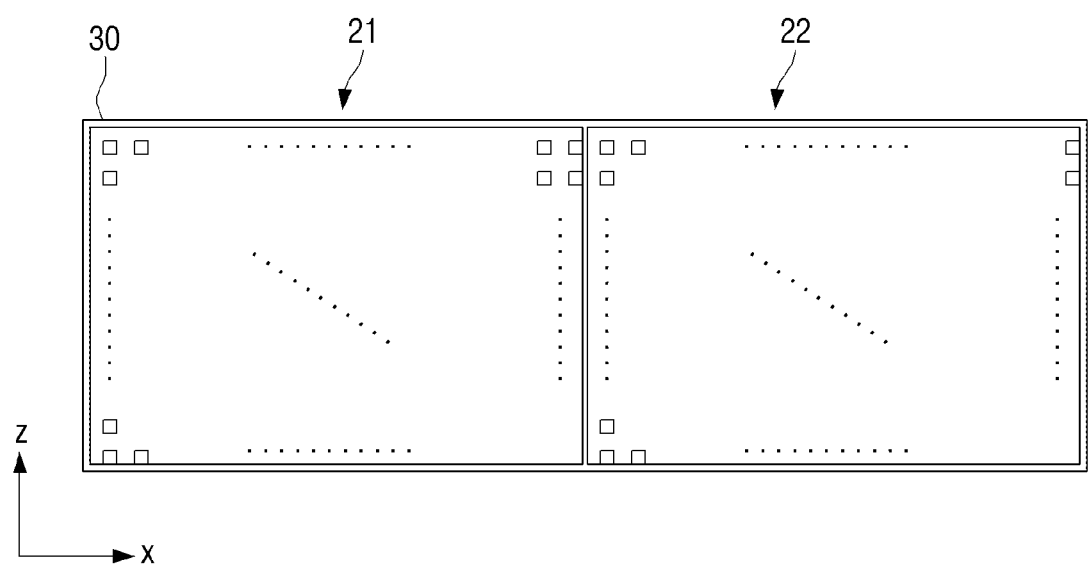
FIG. 5A is a top view illustrating a state of arranging a plurality of display modules.
Figure 5B:
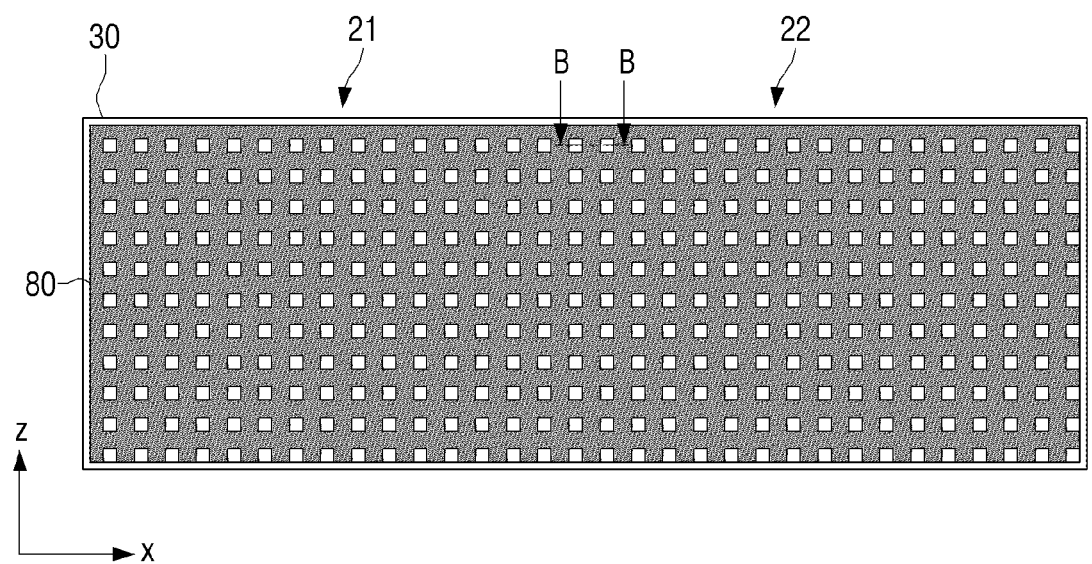
FIG. 5B is a top view illustrating a plurality of display modules on which a non-conductive layer is formed according to an embodiment.
Figure 6:
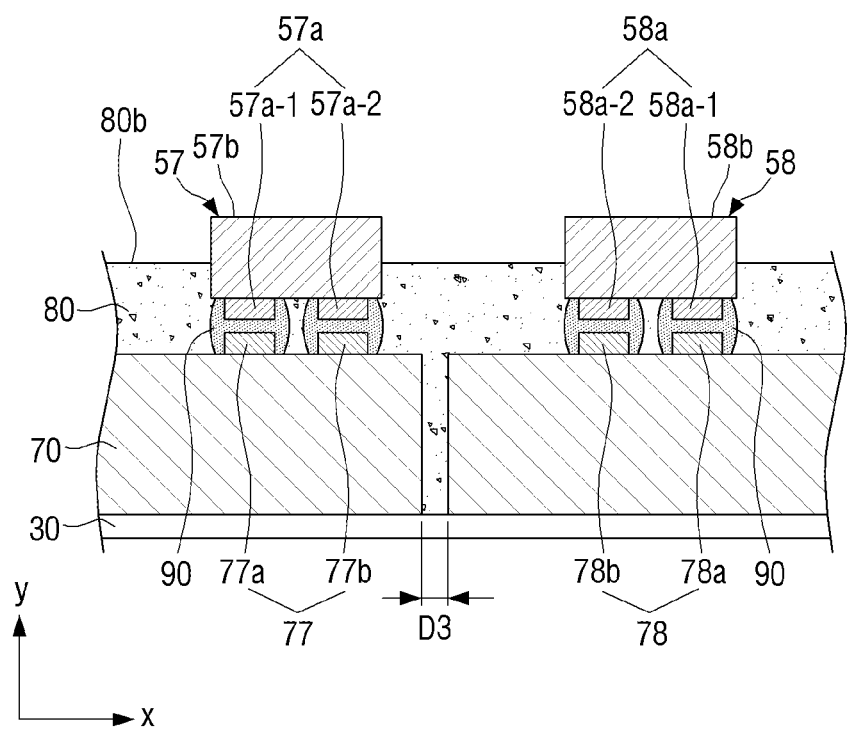
FIG. 6 is a sectional view illustrated along the B-B line of FIG. 5B.

Referring to FIGS. 5A, 5B, and 6, a structure of the non-conductive layer 80 including the fluxing function when the plurality of display modules 21 and 22 are arranged will be specifically described.

FIG. 5A is a top view illustrating a state of arranging a plurality of display modules 21 and 22; FIG. 5B is a top view illustrating a plurality of display modules 21 and 22 on which a non-conductive layer 80 is formed according to an embodiment; and FIG. 6 is a sectional view illustrated along the B-B line of FIG. 5B.

Referring to FIG. 6, micro LEDs 57 and 58 may be substantially the same as the above-described micro LEDs 51, 52, and 53, and the color of the light emitted by the micro LEDs 57 and 58 may vary. A plurality of connection pads 77 and 78, and first and second electrode pads 57a and 58a may have substantially the same structure as the aforementioned plurality of connection pads 71 and 72 and the second electrode pads 51a and 52a described above.

As illustrated in FIG. 5A, the first and second display modules 21 and 22 may be manufactured in a form of a module having a predetermined size, and the first and second display modules 21 and 22 may be arranged on the array plate 30 to implement a display screen of various sizes and forms.

As illustrated in FIG. 5B, the first and second display modules 21 and 22 may be arranged on the array plate 30, and the non-conductive layer 80 including a fluxing function may be formed on an upper surface of the array plate 30.

Specifically, the first and second display modules 21 and 22 may be arranged on the array plate 30, and may be spaced apart by a micro unit interval D3 in order to prevent contact damage between the first and second display modules 21 and 22.

At this point, the non-conductive layer 80 including a fluxing function may be integrally formed with the array plate 30 on top of the first and second display modules 21 and 22 arranged on the array plate 30, and may fill the interval D3 of the first and second display modules 21 and 22.

In other words, the non-conductive layer 80 including a fluxing function formed on an upper portion of each of the plurality of display modules 21 and 22 may be integrally formed with the array plate 30.

Accordingly, when the non-conductive layer 80 including a fluxing function is hardened, the non-conductive layer 80 including a fluxing function may fix the plurality of display modules 21 and 22 at predetermined positions on the array plate 30.

The non-conductive layer 80 including a fluxing function may include a black matrix photo sensitive resin composition for a liquid crystal display including a binder resin, a photopolymer initiator, a black pigment and a solvent, or a resin composition including a black pigment for shielding.

Accordingly, the non-conductive layer 80 including a fluxing function fills or covers a portion corresponding to a seam, which may be seen on a display screen due to an interval D3 between the first and second display modules 21 and 22, and may stably fix the plurality of display modules 20 on the array plate 30 and provide a seamless appearance by covering a seam on a display screen.

Hereinafter, referring to FIGS. 7 to 10, a process of manufacturing a display module according to an embodiment will be described in detail.

FIGS. 7, 8, 9, and 10 are schematic sectional views illustrating a process of manufacturing the display module 21 according to an embodiment.

Figure 7:
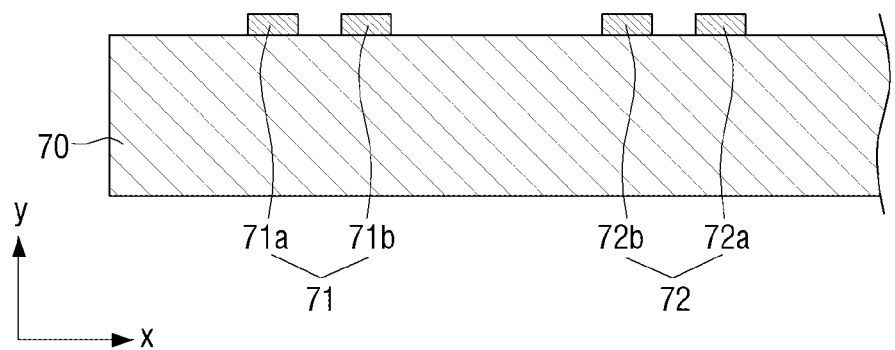
FIGS. 7, 8, 9, and 10 are schematic sectional views illustrating a process of manufacturing a display module according to an embodiment.

As illustrated in FIG. 7, a plurality of connection pads 71 and 72 may be formed on the substrate 70.

Figure 8:
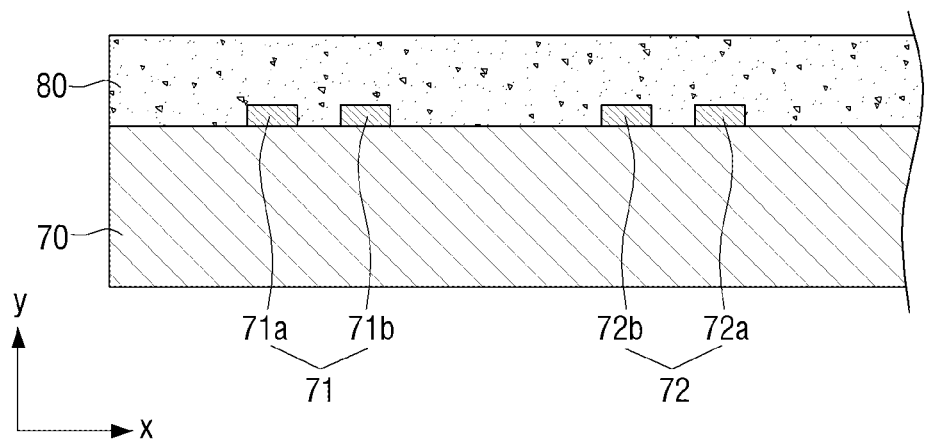

Then, as illustrated in FIG. 8, the non-conductive layer 80 including a fluxing function may be formed on the substrate 70 on which the plurality of connection pads 71 and 72 are formed. At this time, the non-conductive layer 80 may have a predetermined viscosity.

The second height H2 of the non-conductive layer 80 including a fluxing function may be substantially the same along the substrate 70.

Figure 9:
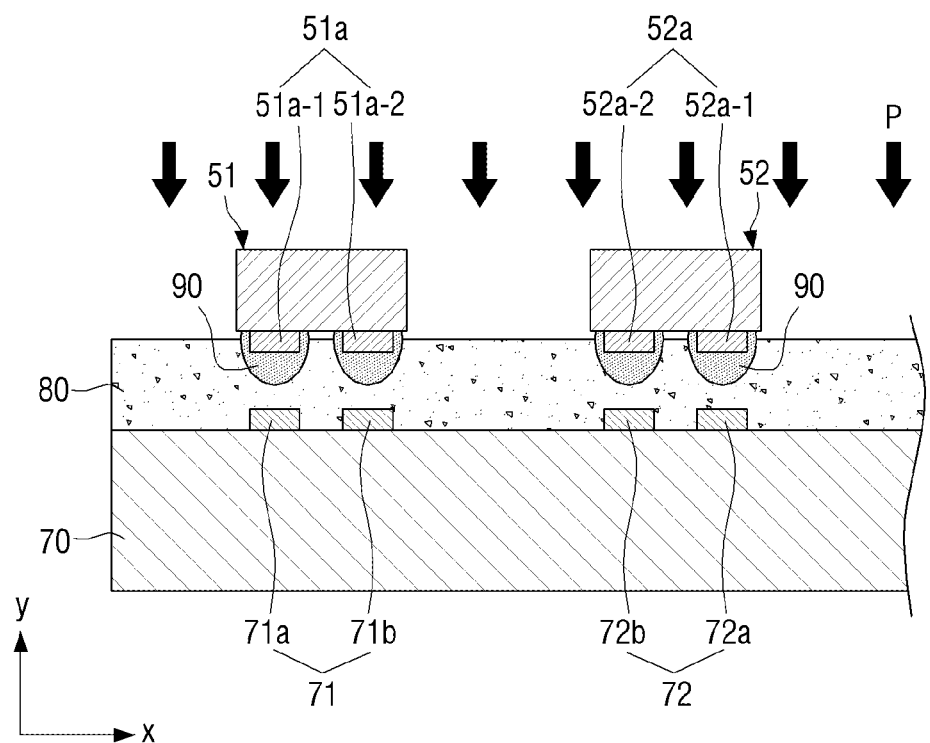
Figure 10:
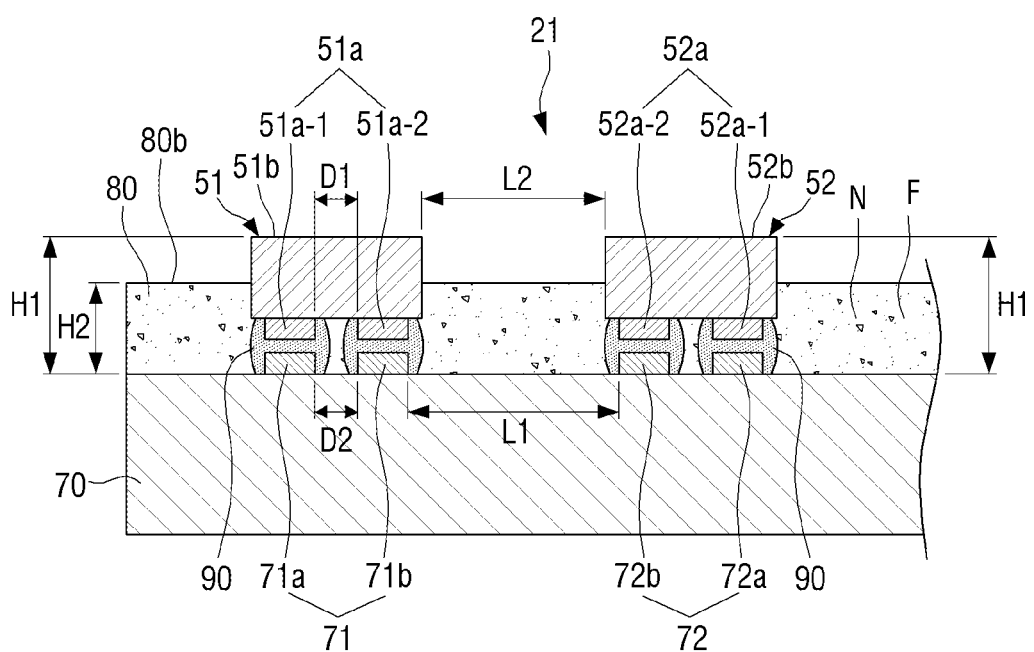

As illustrated in FIG. 9, a plurality of micro LEDs 51 and 52 that have first and second electrode pads 51*a*-1 and 51*a*-2 and 52*a*-1 and 52*a*-2 respectively formed on a surface at predetermined intervals may be arranged on the substrate 70 in which the plurality of connection pads 71*a* and 71*b* and 72*a* and 72*b* electrically connected to each of the first and second electrode pads 51*a*-1 51*a*-2 and 52*a*-1 and 52*a*-2 are formed.

Before the plurality of micro LEDs 51 and 52 are arranged on the substrate 70, the soldering members 90 may be formed on each of the first and second electrode pads 51*a* and 52*a* of the plurality of micro LEDs 51 and 52.

A plurality of micro LEDs 51 and 52 arranged on the substrate 70 may be thermally compressed along the P direction at the same time, and the plurality of micro LEDs 51 and 52 may be electrically and physically connected to the substrate 70.

The plurality of micro LEDs 51 and 52 and the soldering member 90 may contact the non-conductive layer 80, and at the same time, the non-conductive layer 80 is pushed by the plurality of micro LEDs 51 and 52 and the soldering member 90.

At the time when the soldering member 90 is in contact with the connection pads 71 and 72, the surface of the soldering member 90 is melted and the soldering member 90 may electrically and physically connect the first electrode pad 51*a* and the connection pad 71, and may electrically and physically connect the second electrode pad 52*a* and the connection pad 72.

The non-conductive layer 80 including a fluxing function may be hardened at the same time with thermal compression of the plurality of micro LEDs 51 and 52.

Therefore, a separate process is not necessary to harden the non-conductive layer 80 and the soldering member 90, and a manufacturing time and cost may be reduced.

As mentioned above, a method of manufacturing the display module 21 according to an embodiment uses the non-conductive layer 80 including a fluxing function and thus, there is no need to apply and clean a flux and form an under-fill which is a separate insulating resin layer. Thus, a manufacturing process can be simplified, and manufacturing costs may be significantly reduced.

While the non-conductive layer 80 including a fluxing function is formed on the substrate 70, a plurality of micro LEDs 51 and 52 are thermally compressed and thus, the gaps between the first and second connection pads 51*a*-1 and 51*a*-2 of the micro LEDs 51 and 52, and the gaps between the plurality of soldering members 90 may be easily filled, thereby preventing electrical shorts between the plurality of soldering members 90 from occurring.

A metal bonding (soldering) method with good manufacturing efficiency is used, and a manufacturing cost may be reduced significantly.

Figure 11:
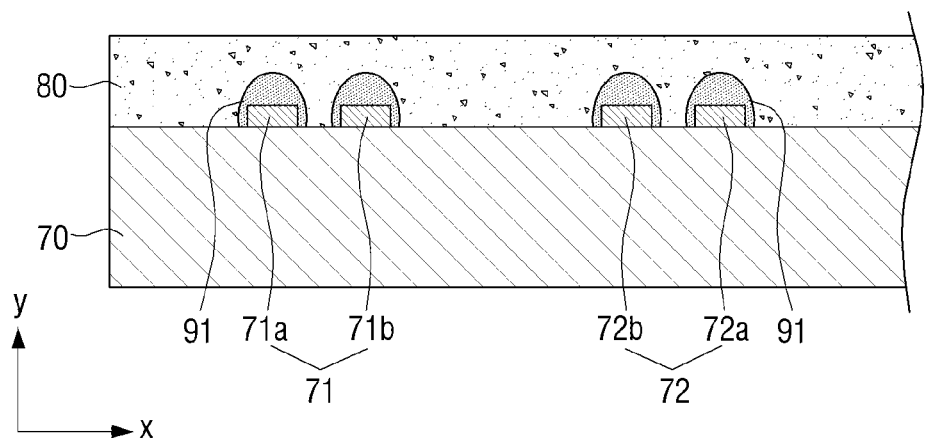
FIGS. 11 and 12 are schematic sectional views illustrating a process of manufacturing a display module according to another embodiment.
Figure 12:
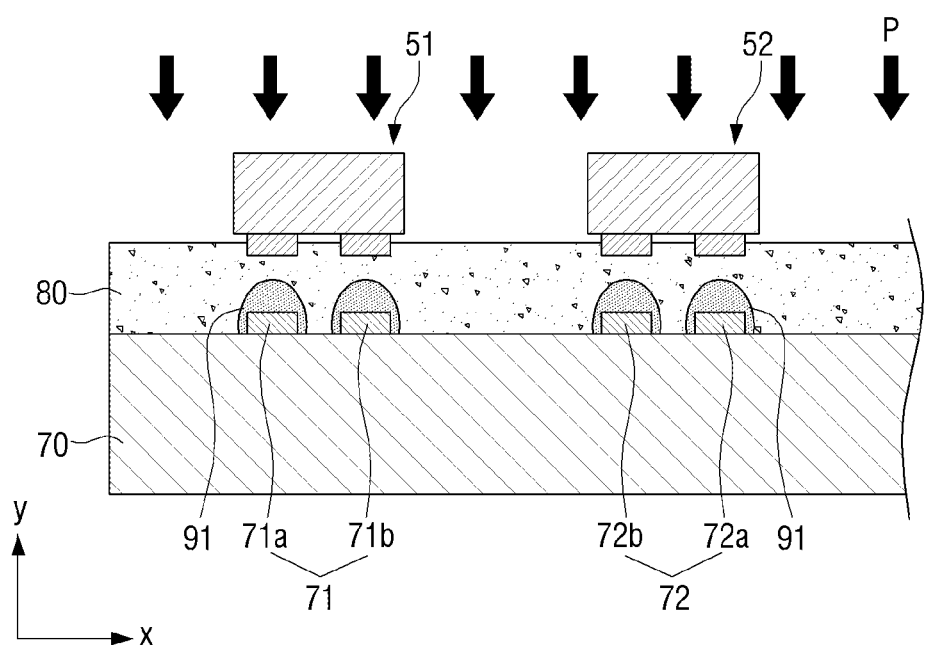

Referring to FIGS. 11 and 12, a process of manufacturing the display module 21 according to another embodiment will be specified.

FIGS. 11 and 12 are schematic sectional views illustrating a process of manufacturing the display module 21 according to another embodiment.

Herein, the same reference numerals are used for the same elements and repeated descriptions are omitted. Specifically, the plurality of micro LEDs 51 and 52, the substrate 70, and the non-conductive layer 80 including a fluxing function may be the same as the aforementioned configuration.

As illustrated in FIG. 11, prior to forming the non-conductive layer 80 on the substrate 70, the soldering member 91 may be formed on each of the plurality of connection pads 71 and 72.

Accordingly, prior to the thermal compression of the plurality of micro LEDs 51 and 52, the non-conductive layer 80 has been already formed between the plurality of soldering members 91 and thus, manufacturing reliability for the structure in which the non-conductive layer 80 is filled between the soldering members 91 may be improved.

Here, the soldering member 91 may be formed of the same material as the aforementioned soldering member 90.

As shown in FIG. 12, a plurality of micro LEDs 51 and 52 arranged on the substrate 70 may be simultaneously heat pressed along the P direction and the plurality of micro LEDs 51 and 52 may be electrically and physically connected to the substrate 70.

The various embodiments have been described individually, but it is not necessary that each embodiment is implemented as a sole embodiment, but configurations and operations of each embodiment can be implemented in combination with at least one other embodiment.

While the disclosure has been shown described with reference to various embodiments thereof, it will be understood by those skilled in the art that various changes in form and details may be made therein without departing from the spirit and scope of the disclosure as defined by the appended claims and their equivalents.

What is claimed is:

1. A display module comprising:
   a substrate;
   a plurality of light-emitting diodes (LEDs) configured to emit light;
   a plurality of soldering members provided between the substrate and the plurality of LEDs, and configured to electrically connect the plurality of LEDs and the substrate; and
   a non-conductive layer provided on the substrate, and configured to fill gaps between the plurality of soldering members,
   wherein the non-conductive layer directly contacts side surfaces of the plurality of LEDs.

2. The display module of claim 1, wherein the non-conductive layer surrounds respective portions of the plurality of LEDs.

3. The display module of claim 2, wherein each LED of the plurality of LEDs comprises a first electrode pad and a second electrode pad that are spaced apart by a predetermined interval,
   the substrate comprises a plurality of connection pads that are electrically connected to the first electrode pads and the second electrode pads, and
   each soldering member of the plurality of soldering members is provided between the first and second electrode pads and the plurality of connection pads.

4. The display module of claim 3, wherein the first electrode pad and the second electrode pad of at least one LED are spaced apart by an interval of less than or equal to 20 micrometers.

5. The display module of claim 2, wherein an upper surface of the non-conductive layer is lower than respective upper surfaces of the plurality of LEDs.

6. The display module of claim 1, wherein the plurality of LEDs comprises:
- a first LED configured to emit red light;
- a second LED configured to emit green light; and
- a third LED configured to emit blue light.

7. The display module of claim 6, wherein the first LED, the second LED, and the third LED are sequentially arranged on the substrate.

8. A display apparatus comprising:
- a plurality of display modules;
- an array plate configured to support the plurality of display modules so that the plurality of display modules are provided in parallel on a same plane; and
- a housing configured to fix the plurality of display modules and the array plate,
- wherein each display module of the plurality of display modules comprises:
  - a substrate;
  - a plurality of light-emitting diodes (LEDs) provided on the substrate, and configured to emit light;
  - a plurality of soldering members provided between the substrate and the plurality of LEDs, and configured to electrically connect the plurality of LEDs and the substrate; and
  - a non-conductive layer formed on the substrate, and configured to fill gaps between the plurality of soldering members, and
- wherein the non-conductive layer directly contacts side surfaces of the plurality of LEDs.

9. The display apparatus of claim 8, wherein the non-conductive layer is surrounds respective portions of the plurality of LEDs.

10. The display apparatus of claim 8, wherein the non-conductive layer is configured to fill gaps between the plurality of display modules.

11. The display apparatus of claim 10, wherein the non-conductive layer that is formed on an upper portion of each display module of the plurality of display modules is integrally formed.

12. The display apparatus of claim 8, wherein each LED of the plurality of LEDs comprises a first electrode pad and a second electrode pad that are spaced apart by a predetermined interval,
- the substrate comprises a plurality of connection pads that are electrically connected to the first electrode pads and the second electrode pads, and
- each soldering member of the plurality of soldering members is provided between the first and second electrode pads and the plurality of connection pads.

* * * * *